United States Patent
Abali et al.

(10) Patent No.: US 9,584,156 B1
(45) Date of Patent: Feb. 28, 2017

(54) CREATING A DYNAMIC HUFFMAN TABLE

(71) Applicant: International Business Machines Corporation, Armonk, NY (US)

(72) Inventors: Bulent Abali, Tenafly, NJ (US); Bartholomew Blaner, Underhill Center, VT (US); Hubertus Franke, Cortlandt Manor, NY (US); John J. Reilly, Huntington, VT (US)

(73) Assignee: International Business Mahcines Corporation, Armonk, NY (US)

( * ) Notice: Subject to any disclaimer, the term of this patent is extended or adjusted under 35 U.S.C. 154(b) by 0 days.

(21) Appl. No.: 14/943,590

(22) Filed: Nov. 17, 2015

(51) Int. Cl.
H03M 7/40 (2006.01)
H03M 7/42 (2006.01)

(52) U.S. Cl.
CPC .................. H03M 7/42 (2013.01)

(58) Field of Classification Search
CPC ....................................... H03M 7/42
USPC ............... 341/50, 65, 67, 106, 51, 52
See application file for complete search history.

(56) References Cited

U.S. PATENT DOCUMENTS

| | | | | |
|---|---|---|---|---|
| 5,848,195 A | * | 12/1998 | Romriell | H03M 7/42 358/1.9 |
| 6,839,005 B1 | * | 1/2005 | Singhal | H03M 7/40 341/67 |
| 7,834,781 B2 | | 11/2010 | Biran et al. | |
| 8,610,606 B2 | | 12/2013 | Glass et al. | |
| 2010/0315269 A1 | * | 12/2010 | Wang | H03M 7/425 341/65 |

* cited by examiner

Primary Examiner — Peguy Jean Pierre
(74) Attorney, Agent, or Firm — Jennifer R. Davis; Michael J. Chang, LLC

(57) ABSTRACT

Techniques for creating a dynamic Huffman table in hardware are provided. In one aspect, a method for encoding data includes the steps of: implementing dynamic Huffman tables in hardware representing a plurality of Huffman tree shapes precomputed from a sample data set, wherein the Huffman tree shapes are represented in the dynamic Huffman tables by code length values; upon receipt of input data, writing symbols and their counts from the input data to the dynamic Huffman tables; calculating a score for each of the dynamic Huffman tables with the symbols and counts from the input data, wherein the score is based on the code length values of the precomputed Huffman tree shapes and the counts from the input data and selecting a given one of the dynamic Huffman tables having a lowest score for encoding the input data. A process for implementing the present techniques in SRAM is also provided.

20 Claims, 5 Drawing Sheets

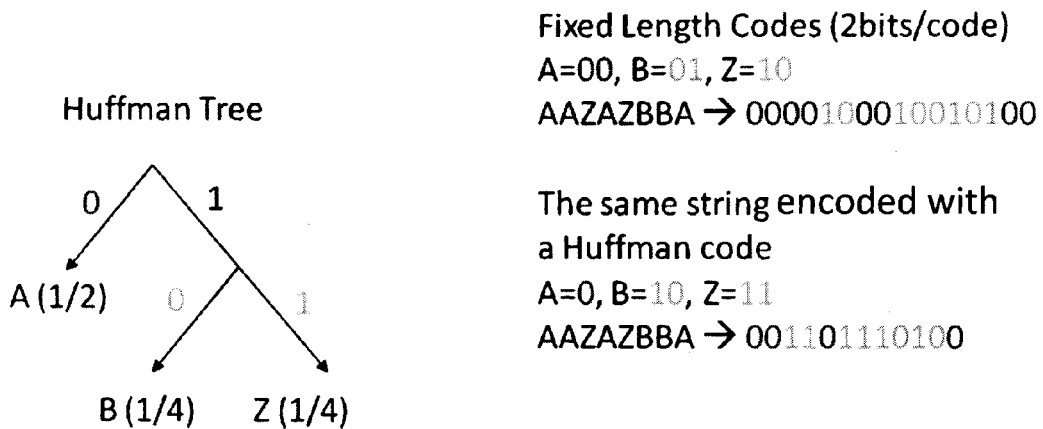
FIG. 1
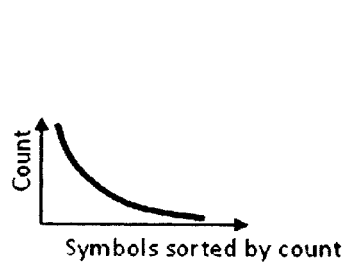
FIG. 2a
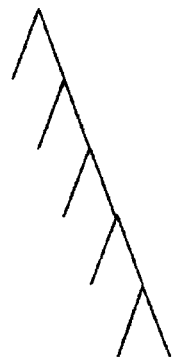
FIG. 2b
| Len | Count | Sym |
|-----|-------|-----|
| 1 | 0 | ? |
| 2 | 0 | ? |
| 3 | 0 | ? |
| 4 | 0 | ? |
| ... | | |
| 15 | 0 | ? |
FIG. 2c

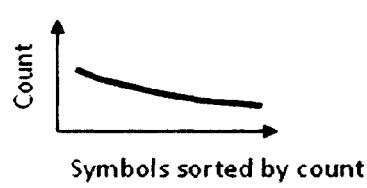
FIG. 3a
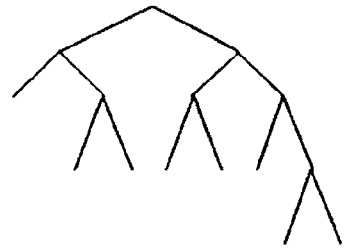
FIG. 3b
| Len | Count | Sym |
|-----|-------|-----|
| 2   | 0     | ?   |
| 3   | 0     | ?   |
| 3   | 0     | ?   |
| 3   | 0     | ?   |
| 3   | 0     | ?   |
| 3   | 0     | ?   |
| ... |       |     |
| 15  | 0     | ?   |
FIG. 3c
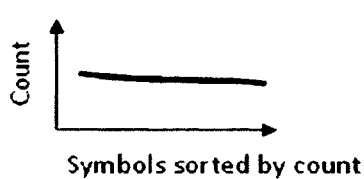
FIG. 4a
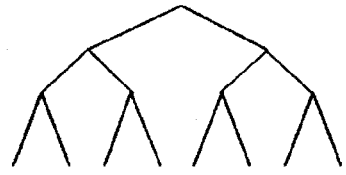
FIG. 4b
| Len | Count | Sym |
|-----|-------|-----|
| 7   | 0     | ?   |
| 7   | 0     | ?   |
| 7   | 0     | ?   |
| 7   | 0     | ?   |
| ... |       |     |
| 8   | 0     | ?   |
| 8   | 0     | ?   |
| ... |       |     |
| 9   | 0     | ?   |
FIG. 4c

| Len | Count | Sym |
|---|---|---|
| 1 | 1000 | A |
| 2 | 500 | Z |
| 3 | 300 | B |
| 4 | 5 | Q |
| ... | | |
| 15 | 0 | – |

Total Len = 2920 bits

FIG. 5a

| Len | Count | Sym |
|---|---|---|
| 2 | 1000 | A |
| 3 | 500 | Z |
| 3 | 300 | B |
| 3 | 5 | Q |
| 3 | 0 | – |
| 3 | 0 | – |
| ... | | |
| 15 | 0 | – |

4415 bits

FIG. 5b

| Len | Count | Sym |
|---|---|---|
| 7 | 1000 | A |
| 7 | 500 | Z |
| 7 | 300 | B |
| 7 | 5 | Q |
| ... | | |
| 8 | 0 | – |
| 8 | 0 | – |
| ... | | |
| 9 | 0 | – |

12635 bits

FIG. 5c

CREATING A DYNAMIC HUFFMAN TABLE

FIELD OF THE INVENTION

The present invention relates to Huffman-based data encoding, and more particularly, to techniques for creating a dynamic Huffman table in hardware.

BACKGROUND OF THE INVENTION

Many hardware and software applications use data compression to reduce storage and memory capacity, and to reduce network and input/output bandwidth. Huffman encoding is often used to compress data, for example in the Deflate (gzip) standard. Huffman codes are variable length codes in which most frequent data items are encoded with fewer bits. Dynamic Huffman codes are custom codes constructed on the fly based on the frequency of data items.

Creating a dynamic Huffman (DH) table in hardware is a time and area consuming process. For instance, conventional DH based compression requires software intervention involvement, or a complicated mapping of the Deflate software algorithms to hardware. These may lead to a performance or compression ratio or silicon area penalty.

As a result, many hardware implementations choose to use the fixed Huffman (FH) method instead of the dynamic Huffman (DH) method. The disadvantage of FH is less compression compared to the DH.

Therefore, a simplified and fast technique for creating a dynamic Huffman table in hardware would be desirable.

SUMMARY OF THE INVENTION

The present invention provides techniques for creating a dynamic Huffman table in hardware. In one aspect of the invention, a method for encoding data is provided. The method includes the steps of: implementing dynamic Huffman tables in hardware representing a plurality of Huffman tree shapes precomputed from a sample data set, wherein the Huffman tree shapes are represented in the dynamic Huffman tables by code length values; upon receipt of input data, writing symbols and their counts from the input data to the dynamic Huffman tables; calculating a score for each of the dynamic Huffman tables with the symbols and counts from the input data, wherein the score is based on the code length values of the precomputed Huffman tree shapes and the counts from the input data; and selecting a given one of the dynamic Huffman tables having a lowest score for encoding the input data.

In another aspect of the invention, a static random access memory (SRAM)-based method for encoding data is provided. The method includes the steps of: implementing dynamic Huffman tables in hardware representing a plurality of Huffman tree shapes precomputed from a sample data set, wherein the Huffman tree shapes are represented in the dynamic Huffman tables by code length values, wherein the hardware comprises SRAM modules, and wherein the dynamic Huffman tables are implemented in the hardware by initializing each of the SRAM modules with a sorted list of the code length values for one of the dynamic Huffman tables; upon receipt of input data, writing symbols and their counts from the input data to the dynamic Huffman tables in each of the SRAM modules; calculating a score for each of the dynamic Huffman tables with the symbols and counts from the input data, wherein the score is based on the code length values of the precomputed Huffman tree shapes and the counts from the input data; and selecting a given one of the dynamic Huffman tables having a lowest score for encoding the input data.

A more complete understanding of the present invention, as well as further features and advantages of the present invention, will be obtained by reference to the following detailed description and drawings.

BRIEF DESCRIPTION OF THE DRAWINGS

FIG. 1 is a diagram illustrating an exemplary prefix code constructed using the Huffman algorithm according to an embodiment of the present invention;

FIG. 2a is a diagram illustrating a histogram of a highly skewed symbol distribution according to an embodiment of the present invention;

FIG. 2b is a diagram illustrating a Huffman tree shape of the highly skewed symbol distribution according to an embodiment of the present invention;

FIG. 2c is a diagram illustrating a precomputed table of the highly skewed symbol distribution according to an embodiment of the present invention;

FIG. 3a is a diagram illustrating a histogram of a medium skewed symbol distribution according to an embodiment of the present invention;

FIG. 3b is a diagram illustrating a Huffman tree shape of the medium skewed symbol distribution according to an embodiment of the present invention;

FIG. 3c is a diagram illustrating a precomputed table of the medium skewed symbol distribution according to an embodiment of the present invention;

FIG. 4a is a diagram illustrating a histogram of a low skewed symbol distribution according to an embodiment of the present invention;

FIG. 4b is a diagram illustrating a Huffman tree shape of the low skewed symbol distribution according to an embodiment of the present invention;

FIG. 4c is a diagram illustrating a precomputed table of the low skewed symbol distribution according to an embodiment of the present invention;

FIG. 5a is a diagram illustrating symbols and counts having been written to the table of FIG. 2c according to an embodiment of the present invention;

FIG. 5b is a diagram illustrating symbols and counts having been written to the table of FIG. 3c according to an embodiment of the present invention;

FIG. 5c is a diagram illustrating symbols and counts having been written to the table of FIG. 4c according to an embodiment of the present invention;

DETAILED DESCRIPTION OF PREFERRED EMBODIMENTS

Figure 6:
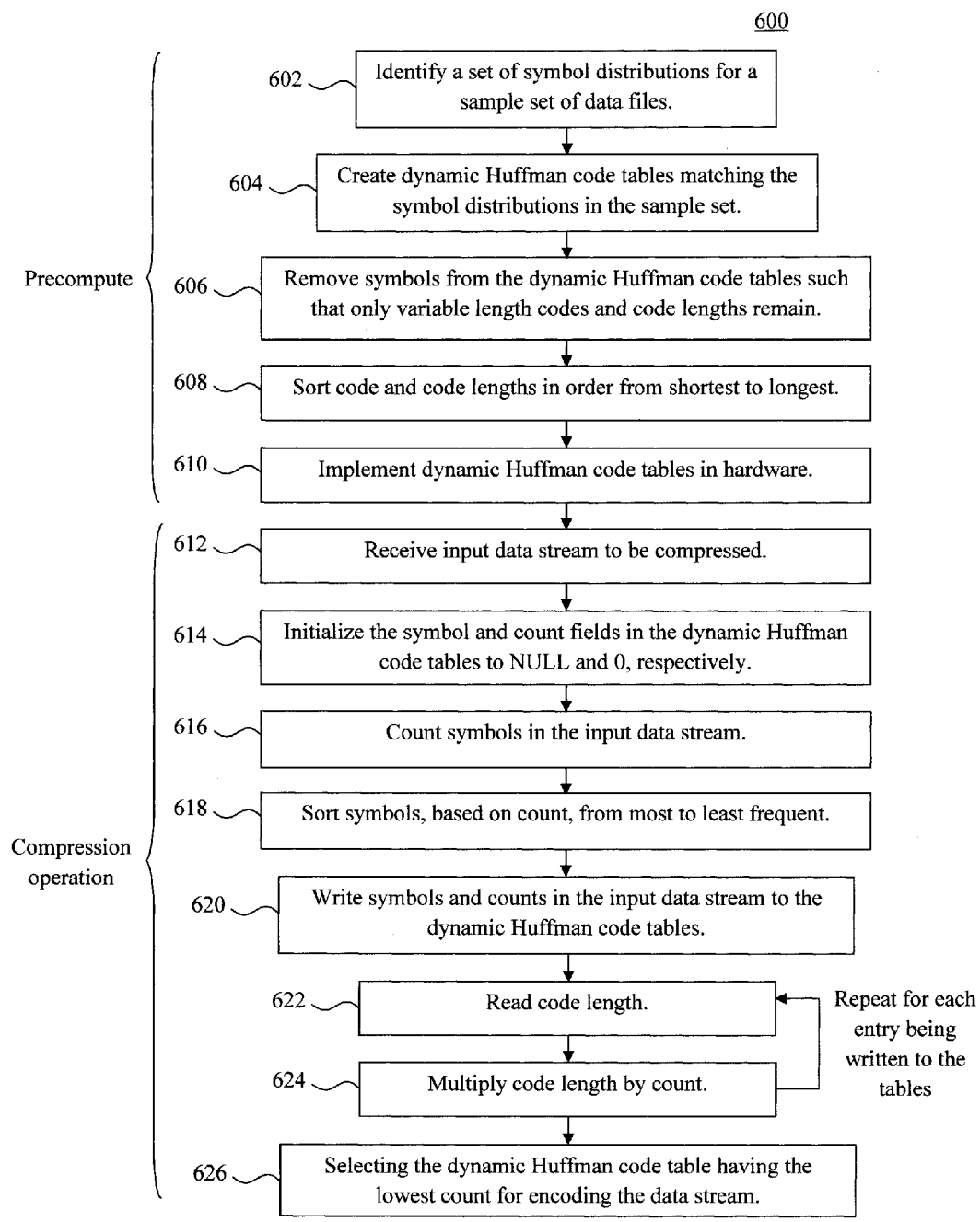
FIG. 6 is a diagram illustrating an exemplary methodology for creating a dynamic Huffman table according to an embodiment of the present invention.

As provided above, conventional dynamic Huffman (DH) based compression requires software intervention. Advantageously, provided herein are simplified and fast techniques for creating a DH table in hardware. As will be described in detail below, the present techniques generally involve a hardware method for creating a prefix tree, where multiple tree shapes and tables representative of symbol frequencies and some table creation steps are precomputed during the pre-silicon step, therefore resulting in a simplified hardware implementation. The total bit cost of each table is calculated and the table with the smallest output size is selected for use in compression.

As is known in the art, the Huffman algorithm is used during compression to produce variable length prefix codes. The more frequent symbols get fewer bits, therefore achieving better compression. FIG. 1 is an example of a prefix code constructed using the Huffman algorithm. Symbols to be encoded (in this example A, B, and Z) are assigned to the leaves of a binary tree. A prefix code is derived by following the branches from root to the symbol leaf. For example, symbol A is encoded with the binary bits '0,' B is encoded with the binary bits '10,' and Z with '11.' The Huffman algorithm creates an optimized binary tree shape resulting in smallest number of total bits. In the instant example, the symbol probabilities are such that the symbol A occurs ½ of the time in the data stream, and B and Z occur ¼ of the time. The tree shape is such that A's code has fewer bits than the code for B and Z.

With conventional processes, these symbol probabilities are used to generate a custom tree at run time. By comparison, the present techniques simplify the DH hardware by precomputing a set of tables each representing a tree shape, instead of attempting to create trees at run time as in conventional processes. A plurality of these precomputed tables are embedded in hardware, and are ready to be used before any compression operation starts. In the exemplary implementation presented herein each table resides in a Static Random Access Memory (SRAM).

Each table represents a distribution of symbols. Precomputed tables are chosen to represent a plurality of symbol distributions. Depending on the distribution of symbols in the input data to be compressed, one table will yield a better compression ratio than the other.

FIGS. 2-4 represent three different symbol distributions, i.e., high, medium, and low skewed symbol distributions, respectively. In each of FIGS. 2-4, a histogram of symbols is provided with the most frequent symbol at the origin, and the least frequent symbol farthest from the origin on the x-axis. Also provided is a tree shape representing the Huffman tree shapes that would have been generated by the respective (high, medium, or low) symbol distribution. Finally, each of FIGS. 2-4 provides the present precomputed table. These histograms, Huffman tree shapes, and precomputed table features are given the reference numerals a, b, and c in FIGS. 2-4, respectively.

FIGS. 2a-c represents a highly skewed symbol distribution where some symbols occur much more often than the others. Exemplary highly skewed distribution is when some symbols occur more than 2, 3, 4 times or even greater than the occurrence of the next symbol. For example, in uncompressed graphics files the most popular color, such as a background color, may occur hundreds of times more often than the next frequent color. In another example, binary files typically contain the hex '00' tens to hundreds of times more often than the next frequent byte character. FIGS. 3a-c represent a medium skewed distribution. FIGS. 4a-c represent a low skewed distribution where symbols occur about the same frequency in the input stream. In low skewed distributions, symbol frequencies in the file are within a few percentage points of each other. For example, in standard English text, most frequent letters 'e', 't', 'a' occur 12, 9, 8 percent of the time, respectively. The histograms provided in FIGS. 2a, 3a, and 4a plot the overall count as a function of symbols sorted by count in each case. As noted above, the most frequent symbols are at the origin, and the least frequent symbols are farthest from the origin on the x-axis. Thus, as is expected, the histograms become more flat with less of a difference in the frequency of occurrence of the symbols (i.e., moving from the corresponding highly skewed to low skewed symbol distributions). The tree shapes provided in FIGS. 2b, 3b, and 4b represent the Huffman tree shapes that would have been generated by these high, medium, low skewed symbol distributions.

The present precomputed tables each representing the respective tree shape and symbol distribution are provided in FIGS. 2c, 3c, and 4c. While the input stream may be encoded with any of the tables shown, depending on the symbol distribution one of the tables will yield the best compression ratio, i.e., a smallest compressed output.

Advantageously, the assignment of symbols to the Huffman tree leaves (i.e., the tables) is done at the time of compression. In other words, the shape of the tree (i.e., represented by the respective table) has been pre-computed, but the symbols that would have been at the leaves of a Huffman tree are initially not assigned and deferred to the actual compression step. The example provided in FIGS. 2-4 represents this initial condition by having no symbols (i.e., a question mark '?' is used) assigned to the tree leaves unlike the Huffman tree example shown in FIG. 1.

In the table representation of the tree (see FIGS. 2c, 3c, and 4c), the code lengths (labeled "Len") are sufficient to describe the shape of the tree, that is the distance of each tree leaf from the tree root is listed in sequence starting with the shortest code to the longest code (1 and 15 bits, respectively, in the exemplary Deflate implementation). For example, the Huffman tree example shown in FIG. 1 may be represented with the code length values 1, 2, 2.

According to the present techniques, each table entry is comprised of the triples {CodeLength, Count, Symbol}, where CodeLength is a precomputed code length of its respective tree shape. Count and Symbol are initially 0 and NULL, respectively. These will be updated during the DH computation step of compression.

When the compression operation starts, input data are scanned and symbol frequencies are determined. For example, if the letter 'A' occurs 1,000 times in the input data, its count is 1000. Symbol counts are sorted from the highest count to the lowest count. Sorting may be done using one of the many different methods known in the art. For example, suitable sorting algorithms include, but are not limited to, Insertion sort, Quick sort, or Bitonic sort algorithms.

In the interest of even further simplifying the hardware, an approximate sorting algorithm may also be used to semi-sort the symbol counts. In that case, only the most frequent symbols are sorted in the correct order, whereas the infrequent symbols are not necessarily sorted in the correct order. For example, in standard English text, most frequent letters 'e, t, a, o, i, n, s, h, r' occur 70% of the time. Sorting these 9 letters in the correct order will achieve 70% of the compression task correctly, whereas getting an order of the remaining letters is less important for improving the compression ratio. It will become apparent from the description that follows that infrequent symbols have a diminishing contribution to the compression ratio. Therefore, a slight increase in the compression ratio may be acceptable in the interest of reduced execution time and silicon area.

Sorted or semi-sorted symbols counts are then written to the precomputed tables fields Count and Symbol. Thus, the triples {CodeLength, Count, and Symbol} are written such that the highest count symbol is paired with the shortest code length, and the $2^{nd}$ highest count symbol is paired with the second shortest code length, and so on. This step is performed in parallel for a plurality of tables. See, for example, FIGS. 5a, b, and c, which illustrate symbols and counts having been written to the tables of FIGS. 2c, 3c, and 4c, respectively.

As each table is being populated with Count and Symbol values, the sum of products CodeLength×Count is also accumulated into a register named TotalLength. According to an exemplary embodiment, one accumulator register per table exists. The sum of products value is the size of the compressed data had that particular table been used to Huffman encode the input data. Accordingly, the best compression ratio is achieved when the table with the smallest TotalLength value is used for compression. For instance, in the example provided in FIGS. 5a-c, the table having the smallest TotalLength value is that in FIG. 5a which has a total length (Total Len) of 2920 bits (as compared to 4415 bits and 12635 bits in the tables of FIGS. 5b and 5c).

It is notable that each precomputed tree shape contains many other sub-trees.

Accordingly, each tree (hence the table) in fact represents a plurality of trees. Therefore, many more symbol distributions are advantageously represented by the limited number of tables implemented in hardware. For example, if a precomputed tree shape has N leaves, it advantageously represents about N different trees with N, N−1, N−2, N−3, . . . 3, 2, 1 leaves. Depending on the number of data symbols being encoded, effectively each table takes the shape of that tree. For example, suppose the input data contains only 4 symbols A, Z, B, and Q but the table has room for 15 symbols. See, for example, FIGS. 5a-c. The table is populated with the symbol counts 1000, 500, 300, and 5 top to bottom. The remaining table entries for all tables' counts will remain at zero. Therefore, effectively the tree shape realized by each table is that of a 4 leaf tree that is a sub-tree of the original larger 15 element tree.

Given the above description, an exemplary implementation of the present techniques for creating a dynamic Huffman table is now described by way of reference to methodology 600 of FIG. 6. As highlighted above, a portion of the process is carried out to precompute tree shapes which are implemented in hardware. Thus, these pre-compute steps need only be performed once, such as during the hardware design or during the hardware power-up initialization. When the compression operation starts, symbols are assigned to the pre-computed tree shapes for each compression operation. Precomputing some of the table creation steps (in hardware) simplifies the operations needed during compression, thereby significantly improving the speed and efficiency of the present process as compared to other DH techniques.

As shown in FIG. 6, the process to precompute the tree shapes begins in step 602 by identifying a set of symbol distributions for a sample set of data files. Namely, since this is a precompute operation (i.e., and a particular input data stream for compression is not yet present), a sample data set is used to compute a plurality of tree shapes. According to an exemplary embodiment, the sample data set includes commonly used data files. Commonly used files are generally specific to each domain. For example, in a computing system handling English text, sample files may be statistically analyzed and tree shapes built according to the frequency of letters of the English alphabet. In another example, in a computing system handling graphics files, sample files may be statistically analyzed and tree shapes built according to the frequency of color information and so on.

In step 604, also as a precomputed operation, DH code tables are created matching the symbol distributions found in the sample data set. As provided above, the code lengths (CodeLength) are sufficient to describe the tree shapes. Thus, in step 604, the CodeLength fields of the DH code tables are populated using the sample data set. The Count and Symbol fields (initially set at 0 and NULL, respectively) will be updated during compression operations—see below.

In step 606, also as a precomputed operation, symbols are removed from the DH Huffman code tables (created in step 604) such that only variable length codes and code lengths remain. Namely, as highlighted above, the present techniques call for populating the tables during compression, therefore by removing symbol to length assignments in step 606, what is left is only the tree shape. The actual symbol to length assignment will be done during compression.

In step 608, also as a precomputed operation, the code and code lengths are sorted using the code length as the sort key in order from shortest to longest. Namely, as provided above, the task here is to list the distance of each tree leaf from the tree root in sequence starting with the shortest code to the longest code. See, for example, FIGS. 2c, 3c, and 4c, where CodeLength is ordered from shortest to longest.

In step 610, the DH code tables are implemented in hardware. An implementation in hardware means that the hardware circuits themselves perform the operation, as opposed to software implementations which recreate the logic in hardware. According to an exemplary embodiment, the present techniques are implemented in hardware using static random access memory (SRAM) modules. As is known in the art, SRAM uses flip-flop circuitry to store each bit of data. See, for example, U.S. Pat. No. 5,744,844 issued to Higuchi, entitled "CMOS SRAM Cell."

As highlighted above, each of the DH code tables implemented in hardware includes 4 fields: Code, CodeLength, Symbol, and Count. At this stage in the process, only the Code and CodeLength fields are populated. The Count and Symbol fields will be updated during a compression operation—see below.

According to an exemplary embodiment, when implemented in SRAM, step 610 includes initializing each SRAM module with a sorted list of code and code lengths, starting with the first SRAM entry, and sequentially onwards. Namely, each symbol distribution from step 602 is written to one SRAM module, for example, by initializing one accumulator per symbol distribution. As is known in the art, an accumulator is a register in which intermediate logic results can be stored.

The precomputing phase of the process is now complete. Steps 602-610 need only be performed once, e.g., during hardware design or initialization. The compression operation commences at step 612, e.g., upon receipt of an input data stream. By comparison with the precomputing operations, the compression steps 612-626 will be performed for each compression operation.

In step 614, the Symbol and Count fields of the DH code tables are initialized to NULL and 0, respectively. Thus, only the Code and CodeLength fields (from the precomputation steps) are currently populated.

To begin processing the input data stream to be compressed, in step 616 the symbols in the input data stream are counted. In step 618, the symbols in the input data stream and their respective counts are sorted, using the count as the sort key, in the order of most frequent to least frequent counts.

In step 620, the symbols and counts from the input data stream are written to the DH code tables in hardware. Up till now, only the Code and CodeLength fields of the tables have been populated. According to an exemplary embodiment, when implemented in SRAM, step 620 includes writing the Symbol and Count fields of the DH code tables to the SRAM starting with the first SRAM entry, and moving sequentially onwards. As provided above, implementing the present tables in SRAM hardware included initializing each SRAM module with a sorted list of code and code lengths, wherein each symbol distribution is written to one SRAM module. Now the symbols and counts are written to each of the SRAM modules. As will be described in detail below, the goal here is to select the symbol distribution with the smallest count for variable length encoding of the input data stream. Since a different symbol distribution is written to each of the SRAM modules, then (as per step 620) applying the symbol counts to each of these distributions can be used to determine which of these distributions gives the smallest count.

For each entry being written in step 620, the code length (as per step 610—see above) is read in step 622. In step 624, the code length is multiplied by the count, and that value is written to the accumulator register. Steps 622 and 624 are repeated until all of the symbols and counts have been written, e.g., to the SRAM modules.

In step 626, the DH code table yielding the lowest count is selected for encoding the input data stream. In the exemplary implementation in SRAM, the accumulator register with the smallest count can be identified in step 626, and the respective SRAM module contents are used for variable length encoding of the input data, namely the codes and code lengths.

The present concept of writing symbols and counts from input data to the precomputed DH tables in hardware, and selecting the lowest count table for use in encoding the input data is further illustrated by way of reference to following non-limiting example. In this example, assume for simplicity that the DH tables shown in FIGS. 2c, 3c, and 4c are what are derived from the sample data, and these tables are implemented in the SRAM modules as described above. Upon receipt of input data, the symbols and their respective counts are then written to the tables in FIGS. 2c, 3c, and 4c. The goal is to first calculate the size of the output if each table is used for the input data, and then selecting the table that produces the lowest output (i.e., the smallest table) for encoding the data. So, for example, populating the table in FIG. 2c might progress as follows: if the symbol A has a code length of 1 and a count of 1000, then the first entry in the table would be {CodeLength, Count, Symbol}={1, 1000, A}; if the symbol B has a code length of 2 and a count of 500, then the second entry in the table would be {CodeLength, Count, Symbol}={2, 500, B}; and so on. The same process is performed for populating the tables in FIG. 3c and in FIG. 4c. A score is then produced for the total counts in each of the tables based on the product of the code lengths and counts. For instance, in the present example, the score for the table in FIG. 2c would be computed as 1×1000 (for entry in table for symbol A)+2×500 (for entry in table for symbol B) . . . and so on. From this, a single score is produced representing the size of the output if the table in FIG. 2c is used. The same process is then used to calculate a score for the table in FIG. 3c, and a score for the table in FIG. 4c. When implemented in SRAM, each score can be stored in the accumulator register of the respective module. The score for each table is compared with the others, and the table producing the lowest score for the input data is selected for encoding. This table having the lowest score will produce the lowest output for the input data.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
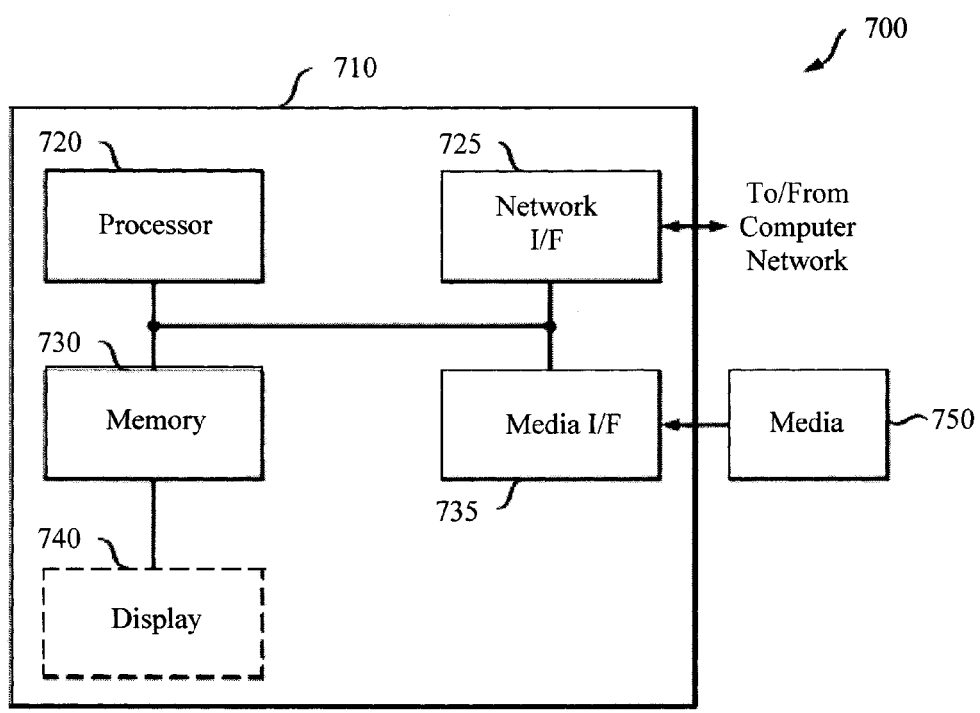
FIG. 7 is a diagram illustrating an exemplary apparatus for performing one or more of the methodologies presented herein according to an embodiment of the present invention.

Turning now to FIG. 7, a block diagram is shown of an apparatus 700 for implementing one or more of the methodologies presented herein. By way of example only, apparatus 700 can be configured to implement one or more of the steps of methodology 600 of FIG. 6.

Apparatus 700 includes a computer system 710 and removable media 750. Computer system 710 includes a processor device 720, a network interface 725, a memory 730, a media interface 735 and an optional display 740. Network interface 725 allows computer system 710 to connect to a network, while media interface 735 allows computer system 710 to interact with media, such as a hard drive or removable media 750.

Processor device 720 can be configured to implement the methods, steps, and functions disclosed herein. The memory 730 could be distributed or local and the processor device 720 could be distributed or singular. The memory 730 could be implemented as an electrical, magnetic or optical memory, or any combination of these or other types of storage devices. Moreover, the term "memory" should be construed broadly enough to encompass any information able to be read from, or written to, an address in the addressable space accessed by processor device 720. With this definition, information on a network, accessible through network interface 725, is still within memory 730 because the processor device 720 can retrieve the information from the network. It should be noted that each distributed processor that makes up processor device 720 generally contains its own addressable memory space. It should also be noted that some or all of computer system 710 can be incorporated into an application-specific or general-use integrated circuit.

Optional display 740 is any type of display suitable for interacting with a human user of apparatus 700. Generally, display 740 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for encoding data, the method comprising the steps of:
    implementing dynamic Huffman tables in hardware representing a plurality of Huffman tree shapes precomputed from a sample data set, wherein the Huffman tree shapes are represented in the dynamic Huffman tables by code length values;
    upon receipt of input data, writing symbols and their counts from the input data to the dynamic Huffman tables;
    calculating a score for each of the dynamic Huffman tables with the symbols and counts from the input data, wherein the score is based on the code length values of the precomputed Huffman tree shapes and the counts from the input data; and
    selecting a given one of the dynamic Huffman tables having a lowest score for encoding the input data.

2. The method of claim 1, wherein the dynamic Huffman tables are implemented in static random access memory (SRAM) modules.

3. The method of claim 2, wherein the step of implementing the dynamic Huffman tables in hardware comprises the step of:
    initializing each of the SRAM modules with a sorted list of the code length values for one of the dynamic Huffman tables.

4. The method of claim 2, wherein the step of writing the symbols and their counts from the input data to the dynamic Huffman tables comprises the step of:
    writing the symbols and their counts from the input data to each of the SRAM modules.

5. The method of claim 1, wherein the step of calculating the score for each of the dynamic Huffman tables comprises the step of:
 determining a sum of a product of a precomputed code length value and a count from the input data for each entry in each of the dynamic Huffman tables.

6. The method of claim 1, wherein the step of implementing dynamic Huffman tables in hardware further comprises the step of:
 identifying a set of symbol distributions for the sample data set.

7. The method of claim 1, wherein the step of implementing dynamic Huffman tables in hardware further comprises the step of:
 removing symbols from the dynamic Huffman tables such that only variable code length values remain.

8. The method of claim 1, wherein the step of implementing dynamic Huffman tables in hardware further comprises the step of:
 sorting the code length values in the dynamic Huffman tables from shortest to longest.

9. The method of claim 1, further comprising the step of:
 upon receipt of input data, initializing symbol fields in the dynamic Huffman tables to NULL and count fields in the dynamic Huffman tables to zero.

10. The method of claim 1, further comprising the step of:
 counting the symbols in the input data.

11. The method of claim 1, further comprising the step of:
 Sorting the symbols in the input data by their count in order from most frequent count to least frequent count.

12. A computer program product for encoding data, the computer program product comprising a computer readable storage medium having program instructions embodied therewith, the program instructions executable by a computer to cause the computer to:
 implement dynamic Huffman tables in hardware representing a plurality of Huffman tree shapes precomputed from a sample data set, wherein the Huffman tree shapes are represented in the dynamic Huffman tables by code length values;
 upon receipt of input data, write symbols and their counts from the input data to the dynamic Huffman tables;
 calculate a score for each of the dynamic Huffman tables with the symbols and counts from the input data, wherein the score is based on the code length values of the precomputed Huffman tree shapes and the counts from the input data; and
 select a given one of the dynamic Huffman tables having a lowest score for encoding the input data.

13. The computer program product of claim 12, wherein when calculating the score for each of the dynamic Huffman tables the program instructions further cause the computer to:
 determine a sum of a product of a precomputed code length value and a count from the input data for each entry in each of the dynamic Huffman tables.

14. The computer program product of claim 12, wherein when implementing the dynamic Huffman tables in hardware the program instructions further cause the computer to:
 identify a set of symbol distributions for the sample data set.

15. The computer program product of claim 12, wherein when implementing the dynamic Huffman tables in hardware the program instructions further cause the computer to:
 remove symbols from the dynamic Huffman tables such that only variable code length values remain.

16. The computer program product of claim 12, wherein when implementing the dynamic Huffman tables in hardware the program instructions further cause the computer to:
 sort the code length values in the dynamic Huffman tables from shortest to longest.

17. The computer program product of claim 12, wherein the program instructions further cause the computer to:
 upon receipt of input data, initialize symbol fields in the dynamic Huffman tables to NULL and count fields in the dynamic Huffman tables to zero.

18. The computer program product of claim 12, wherein the program instructions further cause the computer to:
 count the symbols in the input data.

19. The computer program product of claim 12, wherein the program instructions further cause the computer to:
 sort the symbols in the input data by their count in order from most frequent count to least frequent count.

20. A method for encoding data, the method comprising the steps of:
 implementing dynamic Huffman tables in hardware representing a plurality of Huffman tree shapes precomputed from a sample data set, wherein the Huffman tree shapes are represented in the dynamic Huffman tables by code length values, wherein the hardware comprises SRAM modules, and wherein the dynamic Huffman tables are implemented in the hardware by initializing each of the SRAM modules with a sorted list of the code length values for one of the dynamic Huffman tables;
 upon receipt of input data, writing symbols and their counts from the input data to the dynamic Huffman tables in each of the SRAM modules;
 calculating a score for each of the dynamic Huffman tables with the symbols and counts from the input data, wherein the score is based on the code length values of the precomputed Huffman tree shapes and the counts from the input data; and
 selecting a given one of the dynamic Huffman tables having a lowest score for encoding the input data.

* * * * *